(12) United States Patent
Chittipeddi et al.

(10) Patent No.: US 6,191,017 B1
(45) Date of Patent: Feb. 20, 2001

(54) METHOD OF FORMING A MULTI-LAYERED DUAL-POLYSILICON STRUCTURE

(75) Inventors: Sailesh Chittipeddi, Allentown; Michael J. Kelly, Orefield, both of PA (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/298,068

(22) Filed: Apr. 22, 1999

(51) Int. Cl.⁷ ................... H01L 21/3205; H01L 21/4763
(52) U.S. Cl. ..................... 438/585; 438/152; 438/594; 438/734
(58) Field of Search ..................... 438/149, 151, 438/152, 155, 210, 238, 257, 259, 382, 384, 585, 587, 588, 594, 734

(56) References Cited

U.S. PATENT DOCUMENTS

| 5,814,547 | * | 9/1998 | Chang | 438/329 |
| 5,926,700 | * | 7/1999 | Gardner et al. | 438/152 |
| 6,060,765 | * | 7/1998 | Maeda | 257/635 |
| 6,080,625 | * | 6/2000 | Chittipeddi et al. | 438/259 |
| 6,083,845 | * | 7/2000 | Yang et al. | 438/734 |
| 6,096,584 | * | 8/2000 | Ellis-Monaghan et al. | 438/151 |
| 6,117,732 | * | 9/2000 | Chu et al. | 438/264 |
| 6,121,128 | * | 9/2000 | Hakey et al. | 438/620 |

* cited by examiner

*Primary Examiner*—Olik Chaudhuri
*Assistant Examiner*—Ginette Peralta
(74) *Attorney, Agent, or Firm*—Stroock & Stroock & Lavan LLP

(57) ABSTRACT

A method of forming a multi-layered dual-polysilicon structure that forms a polysilicon gate prior to formation of an ion implantation barrier and that requires fewer steps, is more economical, and permits fabrication of more compact semiconductor circuits and devices than prior art methods.

25 Claims, 3 Drawing Sheets

METHOD OF FORMING A MULTI-LAYERED DUAL-POLYSILICON STRUCTURE

FIELD OF THE INVENTION

This invention relates to integrated circuits and, more specifically, to a method of forming a multi-layered dual-polysilicon semiconductor structure, and devices and integrated circuits formed in accordance therewith.

BACKGROUND OF INVENTION

Multi-layered structures with dual layers of polysilicon over oxide layers of differing thickness have many uses in integrated circuits. Such structures are particularly useful for construction of MOS integrated circuits including Dynamic Random Access Memory (DRAM) cells and Static Random Access Memory (SRAM) cells, for example. The methods of manufacturing multi-layered dual-polysilicon structures currently require multiple and sometimes complicated processing steps including implantation barrier deposition and removal, polysilicon deposition, patterning, and etching.

These multiple, and sometimes repetitive, processing steps increase the fabrication time and expense of manufacturing integrated circuits and semiconductor devices. Moreover, fabrication tolerances are controlled in part by the type and number of processing steps. Thus, fewer and simpler processing steps will yield tighter manufacturing tolerances and denser integrated circuits and semiconductor devices.

Thus there exists a need in the art for a method of forming a multi-layered dual-polysilicon structure that overcomes the above-described shortcomings.

SUMMARY OF THE INVENTION

The present invention is directed to a method that allows formation of dual polysilicon structures prior to formation of an ion implantation barrier structure and that requires fewer steps, is more economical, and permits fabrication of more compact semiconductor circuits and devices than prior art methods.

A preferred embodiment of the present invention is directed to a method of forming a multi-layered dual-polysilicon semiconductor structure. First and second trenches of differing depths are formed in a first insulating layer on the substrate. A second insulating layer is formed in the first and second trenches. Thereafter, polysilicon material is formed in the first and second trenches such that the first and second trenches are substantially filled with the polysilicon material. A portion of the polysilicon material is removed from the first and second trenches so that the top surface of the first insulating layer and a top surface of the polysilicon material are not co-planar (i.e., are not at the same height). An implantation barrier is formed on the polysilicon material in the first and second trenches and processed so that a top surface of the insulating barrier is substantially co-planar with the top surface of the first insulating layer. Ion implantation is then performed to form LDD regions and source and drain regions.

The present invention is also directed to integrated circuits and semiconductor devices constructed in accordance with the above-described method.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference characters denote similar elements throughout the several views.

DETAILED DESCRIPTION OF THE PRESENTLY PREFERRED EMBODIMENTS

Figure 1:
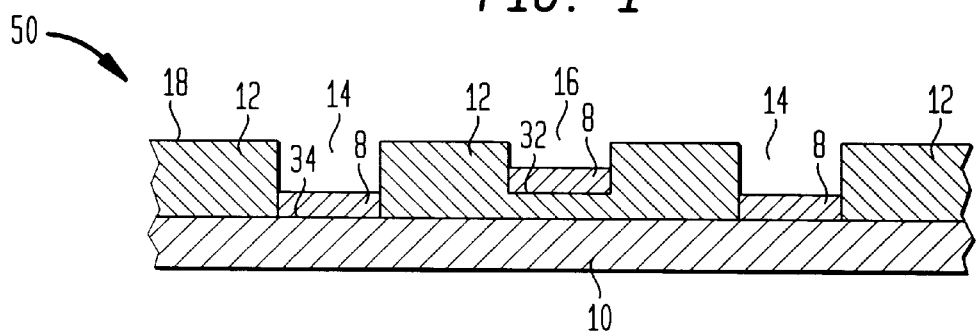
FIGS. 1–4 depict a multi-layered dual-polysilicon structure during successive stages of fabrication in accordance with the method of the present invention.

Referring now to the drawings in detail, FIGS. 1–4 depict a multi-layered dual-polysilicon structure 50 constructed in accordance with the present invention. The structure 50 depicted in FIG. 1 includes a first insulating layer 12 having a top surface 18 and formed on a substrate 10. The first insulating layer 12 is preferably silicon-dioxide, although other known semiconductor insulating materials may also be used. The substrate 10 may be silicon, gallium arsenide, germanium, or other semiconductor materials suitable for use as a substrate. A first trench 14 and a second trench 16 are formed in the first insulating layer 12 by patterning and etching the trench areas using known techniques. Illustratively, the first trench 14 is formed by: 1) applying a layer of resist material on the top surface 18 of the first insulating layer 12; 2) exposing the resist material to an energy source which passes through a pattern mask defined in the resist material; 3) removing areas of resist to form a pattern in the resist; 4) etching the trench 14; and 5) removing the remaining resist material. In a preferred embodiment, the first trench 14 is etched to a depth that is approximately equal to the thickness of the first insulating layer 12, thereby revealing a top surface 34 of the substrate 10.

The second trench 16 is preferably formed after formation of the first trench 14 and in much the same manner. The second trench 16 has a depth that is less than the depth of the first trench 14 and a top surface 32 that lies above (in the drawings) the top surface 34 of the substrate 10. The depth of second trench 16 (or the thickness of the first insulating layer 12 remaining underneath the second trench 16) is dependent upon the desired characteristics of the integrated circuit or device being fabricated.

As depicted in FIG. 1, a second insulating layer 8 is formed in each trench 14, 16. The second insulating layer 8 is preferably silicon-dioxide and may be simultaneously formed in the trenches 14, 16. In the first trench 14, the second insulating layer 8 rests directly on top of the substrate 10, i.e., on the top surface 34.

Figure 2:
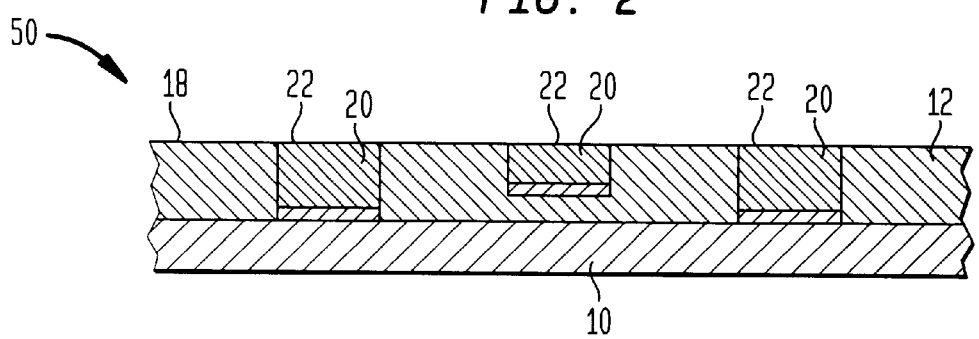

Referring next to FIG. 2, polysilicon 20 is then deposited in the first and second trenches 14, 16 so that the first and second trenches 14, 16 are substantially filled with polysilicon 20 and a top surface 22 of the polysilicon 20 is approximately at the same height as (i.e., are substantially co-planar) with the top surface 18 of the first insulating layer 12. To provide for a substantially co-planar relation between the insulating layer top surface 18 and the polysilicon top surface 22, the structure 50 is subjected to a polishing step such as chemical-mechanical polishing (CMP), for example. The polysilicon 20 may comprise polysilicon only (i.e., a single layer), or alternatively, it may comprise polysilicon, silicide, and/or oxide materials (i.e., multiple layers).

Figure 3:
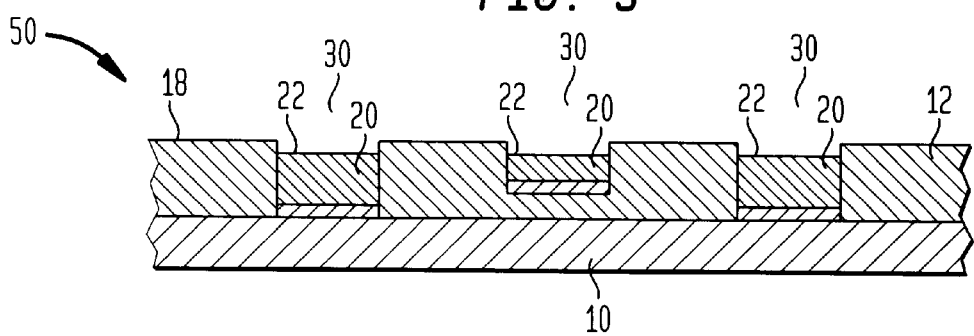

A portion of the polysilicon 20 deposited in the trenches 14, 16 is then removed so that the top surface 22 of the polysilicon 20 is no longer co-planar with the top surface 18 of the first insulating layer 12. This creates a void 30 in the first and second trenches 14, 16 above the polysilicon 20, as depicted in FIG. 3. This is preferably accomplished by an anisotropic etching process. The amount of polysilicon 20 removed by the anisotropic etch will vary depending upon the type of integrated circuit or device ultimately fabricated from the multi-layered structure 50. However, the distance between the top surfaces 18, 22 should be sufficient to permit deposition of an ion implantation barrier 40 (FIG. 4) that will prevent ion penetration into the polysilicon 20 during subsequent processing of the structure 50.

Figure 4:
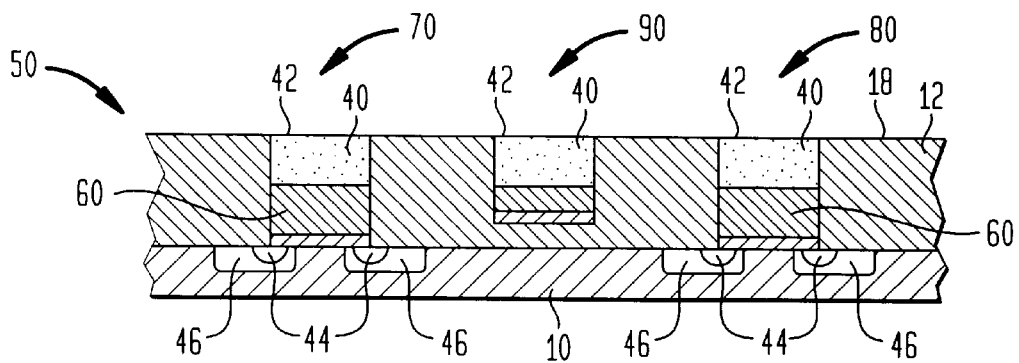

The ion implantation barrier 40 is preferably deposited in a blanket fashion (i.e., simultaneously in both trenches) in trenches 14, 16 until a top surface 42 of the barrier 40 is approximately at the same height as the top surface 18 of the first insulating layer 12. The ion implantation barrier 40 may comprise any material which will not permit implanted ions to penetrate into the polysilicon 20. Typical materials used for the implantation barrier 40 include, by way of non-limiting example, silicon-nitride, tantalum-nitride, titanium-nitride, tungsten-nitride, and zirconium-nitride. The ion implantation barrier 40 is subsequently processed so that its top surface 42 is substantially co-planar with the top surface 18 of the first insulating layer 12 (FIG. 4). This is accomplished by a conventional chemical-mechanical polishing (CMP) technique, or other known planarization techniques, for example. In this manner, a self aligned structure for ion implantation is formed.

Ion implantation is then performed to create a lightly doped diffusion (LDD) region 44, depicted in FIG. 4, and thereafter, the structure 50 is annealed. A spacer oxide 100 (see, e.g., FIG. 6) is then grown over the polysilicon gate 60 (described in further detail below) and source and drain implants are then performed to create source and drain regions 46, as depicted in FIG. 4. The spacer oxide 100 is then removed and the structure 50 may be annealed. The choices of ions and their associated implantation energies are determined by the desired electrical characteristics of the resulting device or integrated circuit. It should be noted that the ion implantation is performed in accordance with standard processing techniques (for example, through a mask of photo-resistive material that has been patterned to reveal the desired implant regions). Subsequently, electrical connections (not shown) are made in conventional ways to the polysilicon gate 60 and to the source and drain regions 46 for form a variety of devices (e.g., transistors, resistors, diodes, capacitors, etc.).

Figure 5:
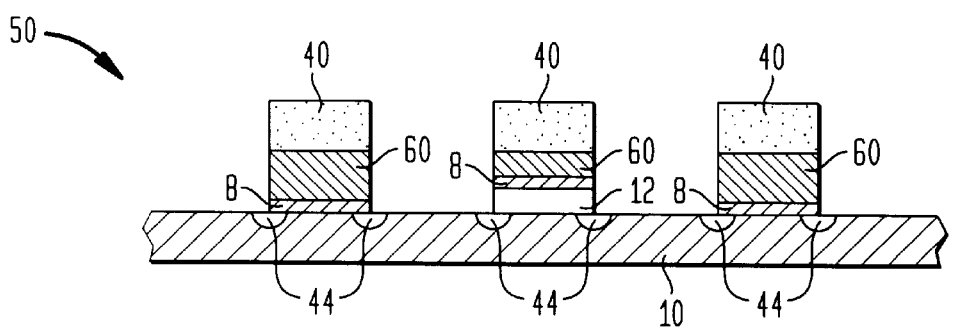
FIG. 5 depicts the multi-layered dual-polysilicon structure of FIGS. 1–4 with the first insulating layer removed.
Figure 6:
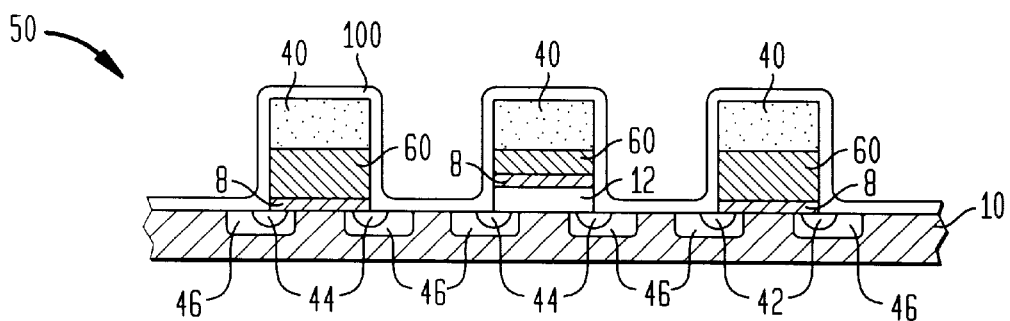
FIG. 6 depicts the structure of FIG. 5 with a spacer oxide.

Alternatively, and as depicted in FIGS. 5 and 6, the first insulating layer 12 may be removed from the polysilicon structure 50 and LDD regions 44 created as described above. A spacer oxide 100 may then be formed, deposited, grown, etc., over the structure 50 which will act as a mask for the LDD region 44. Source and drain regions 46 may then be created using known methods and techniques.

The polysilicon 20 in the first trench 14 may comprise a polysilicon gate 60 (FIG. 4) of a metal-oxide-semiconductor (MOS) transistor. The thickness of the gate 60 is determined by the desired characteristics of the structure. The purpose of the polysilicon 20 in the second trench 16 varies based on the application as described below. For example, the high resistivity of undoped polysilicon makes it especially well-suited for providing high-value resistors in static memories.

The insulating layer 8 in the first and second trenches 14, 16 may constitute the gate oxide layer in a conventional MOS transistor. The thickness of the insulating layer 8 is determined by the desired characteristics of the structure.

The particular illustrative structure 50 depicted in FIG. 4 includes two MOS transistors 70, 80 aligned with the first trenches 14. Further, the polysilicon 20 formed in the second trench 16 may be used to create a discrete component 90 such as, by way of non-limiting example, a capacitor, a resistor, or a transistor, or interconnect with a gate oxide comprised of insulating layers 8 and 12, that is thicker than that of the transistor devices 70, 80 formed in first trench 14.

It is desirable to prevent ion penetration into the polysilicon gate 60. Polysilicon material is then deposited in the trenches 14, 16, and another implantation barrier is formed above the polysilicon material to prevent ion penetration into the polysilicon during implantation of the LDD, source and drain regions 46.

The present invention greatly simplifies the above-described process and reduces the complexity and expense of fabricating multi-layered dual-polysilicon structures. In accordance with the present invention, the polysilicon gate 60 (i.e., polysilicon material 20 in the trenches 14, 16) is formed prior to formation of an implantation barrier. Thus, the gate and barrier are formed in successive, non-repetitive steps. The LDD regions 44 and the source and drain regions 46 may then be created without having to add or remove implantation barrier(s).

Figure 7:
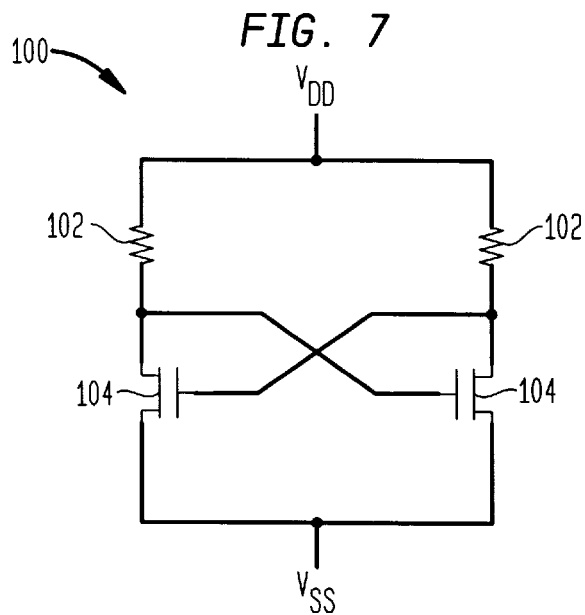
FIGS. 7–9 depict exemplary MOS integrated circuits constructed in accordance with the method of the present invention.
Figure 8:
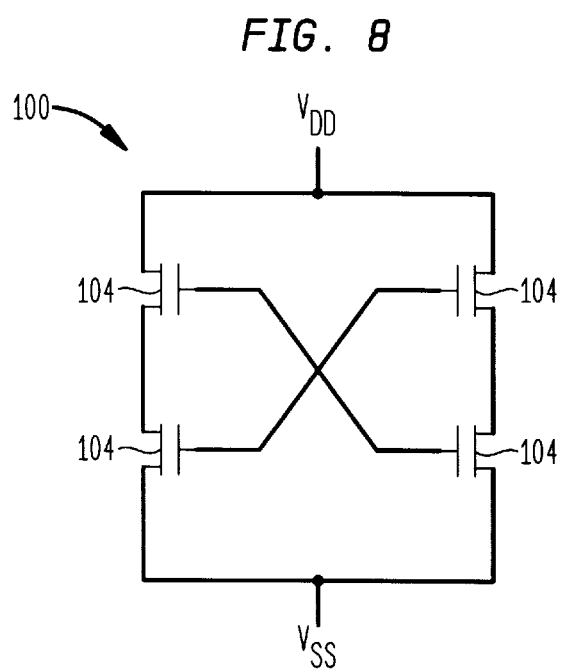
Figure 9:
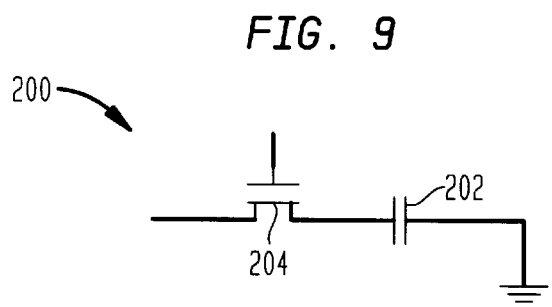

FIGS. 7–9 are illustrative devices that may formed using in accordance with the method of the present invention. It will be obvious to persons skilled in the art that the devices depicted in FIGS. 7–9 are merely illustrative, non-limiting examples and that many other devices are contemplated by the present invention. The device depicted in FIG. 7 is an SRAM cell 100 having resistors 102 formed using the second trench 16 and transistors 104 formed using the first trenches 14.

The device depicted in FIG. 8 is alternative SRAM cell 100 having four transistors 104 formed using both the first and second trenches for interconnects 14, 16. Subsequent metal layers may be formed to interconnect transistors 104 as is well known.

The device depicted in FIG. 9 is a DRAM cell 200 having a capacitor 202 formed using the second trench 16 and a transistor 204 formed using the first trenches 14. Subsequent metal layers may be formed to interconnect capacitor 202 and transistor 204 as is well known.

Finally, it is to be understood that although the invention is disclosed herein in the context of particular illustrative embodiments, those skilled in the art will be able to devise numerous alternative arrangements. Such alternative arrangements, although not explicitly shown or described herein, embody the principles of the present invention and are thus within its spirit and scope.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A method of forming a multi-layered semiconductor structure including a substrate having a first insulating layer disposed thereon, the first insulating layer having a top surface, said method comprising the steps of:
    (a) forming a first trench and a second trench of differing depths in the first insulating layer;
    (b) forming a second insulating layer in the first and second trenches;
    (c) forming a polysilicon material in the first and second trenches such that the first and second trenches are substantially filled with polysilicon material;
    (d) removing a portion of the polysilicon material from the first and second trenches so that the top surface of the first insulating layer is not co-planar with a top surface of the polysilicon material remaining in each of the first and second trenches;
    (e) forming an implantation barrier in the first and second trenches; and
    (f) processing the implantation barrier in the first and second trenches so that a top surface thereof is substantially co-planar with the top surface of the first insulating layer.

2. The method of claim 1, wherein said step (d) comprises anisotropically etching the polysilicon material.

3. The method of claim 1, wherein said step (f) comprises polishing the top surface of the implantation barrier.

4. The method of claim 1, wherein said step (e) comprises depositing titanium-nitride on the polysilicon material in the first and second trenches.

5. The method of claim 1, wherein said step (e) comprises depositing silicon-nitride on the polysilicon material in the first and second trenches.

6. The method of claim 1, wherein said step (e) comprises depositing tantalum-nitride on the polysilicon material in the first and second trenches.

7. The method of claim 1, wherein said step (e) comprises depositing tungsten-nitride on the polysilicon material in the first and second trenches.

8. The method of claim 1, wherein said step (e) comprises depositing zirconium-nitride on the polysilicon material in the first and second trenches.

9. The method of claim 1, wherein said step (a) comprises first forming a first trench and then forming a second trench that is shallower than the first trench.

10. The method of claim 1, further comprising the step of implanting ions to form a LDD region in the substrate, the implantation barrier preventing penetration of implantation ions into the polysilicon material.

11. The method of claim 10, further comprising the step of implanting ions to form a source and a drain region in the substrate, the implantation barrier preventing penetration of implantation ions into the polysilicon material.

12. The method of claim 11, further comprising the step of annealing the multi-layered structure.

13. The method of claim 1, wherein said step (c) comprises forming polysilicon in the first trench to form a first structure and forming polysilicon in the second trench to form a second structure.

14. The method of claim 13, further comprising forming two first structures and two second structures.

15. The method of claim 14, further comprising the step of interconnecting the two first structures and the two second structures to form an SRAM cell.

16. The method of claim 14, further comprising the step of interconnecting the two first structures and the two second structures to form an DRAM cell.

17. The method of claim 1, wherein said step (c) comprises forming a single layer of polysilicon material in the first and second trenches such that the first and second trenches are substantially filled with the single layer polysilicon material.

18. The method of claim 1, wherein said step (c) comprises forming a multi-layer of polysilicon material in the first and second trenches such that the first and second trenches are substantially filled with multi-layer polysilicon material.

19. The method of claim 1, further comprising the steps of:
    removing the first insulating layer; and
    implanting ions to form a LDD region in the substrate, the implantation barrier preventing penetration of implantation ions into the polysilicon material.

20. The method of claim 19, further comprising the steps of:
    forming a spacer oxide on the semiconductor structure; and
    implanting ions to form a source in a drain region in the substrate, the implantation barrier preventing penetration of implantation ions into the polysilicon material.

21. A semiconductor device formed in accordance with the method of claim 1.

22. The device of claim 21, wherein said semiconductor device includes a resistor and a transistor.

23. The device of claim 21, wherein said semiconductor device includes a capacitor and a transistor.

24. A DRAM cell formed in accordance with the method of claim 1.

25. A SRAM cell formed in accordance with the method of claim 1.

* * * * *